(12) United States Patent
Chin et al.

(10) Patent No.: US 7,837,822 B2
(45) Date of Patent: Nov. 23, 2010

(54) LASER INDUCED THERMAL IMAGING APPARATUS AND METHOD OF FABRICATING ORGANIC LIGHT EMITTING DISPLAY USING THE SAME

(75) Inventors: Byung-Doo Chin, Suwon-si (KR); Mu-Hyun Kim, Suwon-si (KR); Myung-Won Song, Suwon-si (KR); Seong-Taek Lee, Suwon-si (KR); Tae-Min Kang, Suwon-si (KR); Jae-Ho Lee, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 523 days.

(21) Appl. No.: 11/246,254

(22) Filed: Oct. 11, 2005

(65) Prior Publication Data
US 2006/0082640 A1   Apr. 20, 2006

(30) Foreign Application Priority Data
Oct. 15, 2004   (KR) .................... 10-2004-0082724

(51) Int. Cl.
| | |
|---|---|
| B29C 65/18 | (2006.01) |
| B29C 65/56 | (2006.01) |
| B32B 37/10 | (2006.01) |
| B32B 37/14 | (2006.01) |
| B23K 26/02 | (2006.01) |
| B32B 37/30 | (2006.01) |
| B32B 37/02 | (2006.01) |
| B05D 3/14 | (2006.01) |

(52) U.S. Cl. .................. 156/272.8; 156/272.2; 156/285; 156/379.7; 156/446; 118/305; 118/500; 427/294; 219/121.82

(58) Field of Classification Search .............. 156/272.8, 156/285, 272.2, 379.7, 446; 279/3; 427/294; 269/47, 55, 903, 908; 219/121.82; 118/305, 118/500
See application file for complete search history.

(56) References Cited

U.S. PATENT DOCUMENTS 5,998,085 A   12/1999   Isberg (Continued)

FOREIGN PATENT DOCUMENTS

CN   1233929   11/1999

(Continued)

OTHER PUBLICATIONS

English translation of KR20020016128, Kang et al. Mar. 4, 2002.*

(Continued)

*Primary Examiner*—Philip C Tucker
*Assistant Examiner*—Sonya Mazumdar
(74) *Attorney, Agent, or Firm*—Robert E. Bushnell, Esq.

(57) ABSTRACT

A donor substrate for a laser induced thermal imaging method and an organic light emitting display manufactured using the same are provided. A laser induced thermal imaging apparatus includes a stage grounded by a grounding means, and a method of fabricating an organic light emitting display is capable of controlling static electricity which may be built up while an organic layer is formed using the apparatus.

16 Claims, 6 Drawing Sheets

U.S. PATENT DOCUMENTS

| | | | |
|---|---|---|---|
| 6,114,085 | A | 9/2000 | Padmanaban et al. |
| 6,132,818 | A * | 10/2000 | Tanaka et al. ............... 427/596 |
| 6,214,520 | B1 | 4/2001 | Wolk et al. |
| 6,592,671 | B2 * | 7/2003 | Sun et al. .................... 118/625 |
| 6,853,426 | B2 * | 2/2005 | Koike et al. ................. 349/126 |
| 7,294,444 | B2 * | 11/2007 | Kim et al. ................... 430/200 |
| 2002/0153899 | A1 * | 10/2002 | Watanabe et al. ........... 324/537 |
| 2004/0120179 | A1 * | 6/2004 | Ishigaki et al. .............. 365/149 |
| 2004/0164061 | A1 * | 8/2004 | Takeuchi et al. ....... 219/121.73 |
| 2004/0246309 | A1 * | 12/2004 | Watanabe .................... 347/55 |

FOREIGN PATENT DOCUMENTS

| | | | |
|---|---|---|---|
| CN | 1089655 C | * | 8/2002 |
| CN | 1535823 | | 10/2004 |
| JP | 06169008 A | * | 6/1994 |
| JP | 2001-310490 | | 11/2001 |
| JP | 2002-086939 | | 3/2002 |
| JP | 2002-341351 | | 11/2002 |
| JP | 2004-079540 | | 3/2004 |
| JP | 2004079540 A | * | 3/2004 |
| KR | 1020010015066 | | 2/2001 |
| KR | 10-2002-0016128 | | 3/2002 |
| KR | 2002-0064302 | | 8/2002 |
| WO | WO 9842474 A1 | * | 10/1998 |
| WO | 2004/080725 | | 9/2004 |

OTHER PUBLICATIONS

Translation of the Office Action for JP 2005-301366 (AIPN system from JPO); Nov. 17, 2008.*

*Office action* from the State Intellectual Property Office of P. R. China issued in Applicant's corresponding Chinese Patent Application No. 200510112769.3 dated Oct. 26, 2007.

*Office action* from the Korean Intellectual Property office issued in Applicant's corresponding Korean Patent Application No. 10-2004-0082724 dated Apr. 25, 2006.

Japanese Office Action issued in corresponding Japanese Patent Application No. 2005-301366 on Nov. 25, 2008.

* cited by examiner

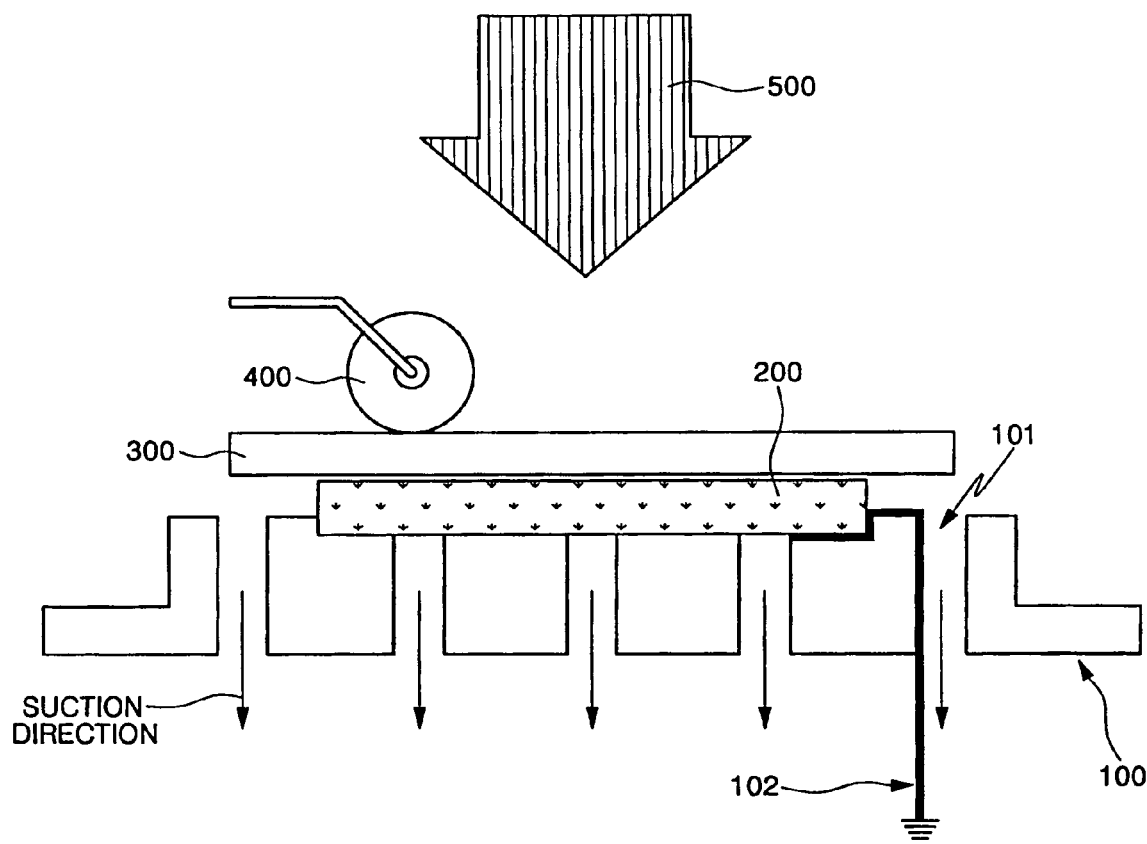

LASER INDUCED THERMAL IMAGING APPARATUS AND METHOD OF FABRICATING ORGANIC LIGHT EMITTING DISPLAY USING THE SAME

CLAIM OF PRIORITY his application makes reference to, incorporates the same herein, and claims all benefits accruing under 35 U.S.C. §119 from an application earlier filed in the Korean Intellectual Property Office on 15 Oct. 2005 and there duly assigned Serial No. 10-2004-0082724.

BACKGROUND OF THE INVENTION

1. Field of the Invention

The present invention relates to a laser induced thermal imaging apparatus including a stage grounded by a grounding means to control static electricity, and a method of fabricating an organic light emitting display (OLED) using the same.

2. Description of the Related Art

Recently, an OLED is attracting attention as a next generation display, since the OLED has low voltage driving, high luminous efficiency, wide viewing angle and rapid response speed characteristics to display high resolution motion pictures.

In addition, the OLED is a self-emissive display which is formed of an organic layer including an organic emission layer between an anode electrode and a cathode electrode, and emits light by recombination of holes and electrons in the organic emission layer when a voltage is applied between the two electrodes so that the OLED does not need a separate backlight used in an LCD, thereby manufacturing lightweight and slim-sized OLED and simplifying the process.

In this process, the OLED may be classified into a small molecule OLED and a polymer OLED according to materials of the organic layer, particularly, the organic emission layer.

The small molecule OLED is formed of a plurality of organic layers having different functions between an anode electrode and a cathode electrode, including a hole injection layer, a hole transport layer, an emission layer, a hole blocking layer, an electron injection layer and so on, thereby enabling adjustment by doping impurities into the organic layers to prevent accumulation of charges or replacing the organic layers with a material having an appropriate energy level. In this process, since the organic layers are generally formed by a vacuum deposition method, it is difficult to realize a large-sized display.

On the other hand, the polymer OLED may be formed in a single layer structure including an organic emission layer between an anode electrode and a cathode electrode, or a dual-layer structure further including a hole transport layer, thereby manufacturing an OLED with thin layers. In addition, the organic layer can be manufactured under a normal pressure since it is formed by a wet coating method, thereby reducing the manufacturing cost and easily fabricating a large-sized display.

In case of manufacturing a monochrome device, the polymer OLED can be readily manufactured using a spin coating process, but has lower efficiency and life span characteristics compared to the small molecule OLED. In addition, in case of a full color device, an emission layer representing primary colors of red (R), green (G) and blue (B) can be patterned on the OLED to realize a full color device. In this process, the organic layer of the small molecule OLED can be patterned by a deposition method using a shadow mask, and the organic layer of the polymer OLED can be patterned by an inkjet printing method or a laser induced thermal imaging (LITI) method. Among them, the LITI method can make the OLED have excellent intra-pixel uniformity when the large-sized display is performed, since the LITI method can use the characteristics of the spin coating method. In addition, since the LITI method is a dry process rather than a wet process, it is possible to solve a reduction of life span due to a solvent, and finely pattern the organic layer.

In order to employ the LITI method, basically, a light source, OLED substrates, i.e., a substrate and a donor substrate are required, and the donor substrate is formed of a base layer, a light-to-heat conversion layer, an intermediate layer, and an organic layer.

The LITI method includes absorbing light emitted from the light source into the light-to-heat conversion layer to convert the light to heat energy, and transferring an organic material formed on a transfer layer to the substrate using the converted heat energy.

A method of forming a pattern of an OLED using the LITI method is disclosed in Korean Patent Registration No. 10-342653, and U.S. Pat. Nos. 5,998,085, 6,214,520 and 6,114,085.

FIGS. 1A to 1C are cross-sectional views illustrating an organic layer patterning process using an LITI method.

Referring to FIG. 1A, a substrate 10 is provided, and a donor substrate 20 including a base layer 21, a light-to-heat conversion layer 22 and an organic layer 23 is laminated on the substrate 10.

Then, as shown in FIG. 1B, light by a laser X is irradiated on a first region (a) of the base layer 21 of the donor substrate 20. The light passed through the base layer 21 is converted to heat in the light-to-heat conversion layer 22, and the adhesion between the organic layer 23 and the light-to-heat conversion layer 22 in the first region (a) is degraded due to the heat.

Then, as shown in FIG. 1C, after the organic layer 23, which has the degraded adhesion, i.e., in the first region (a) is transferred onto the substrate 10, when the donor substrate 20 is detached from the substrate 10, the transferred organic layer 23a is attached on the substrate 10, and the organic layer 23b in the second region (b), at which the light is not irradiated, is detached from the substrate 10 together with the donor substrate 20, thereby forming a patterned organic layer 23a.

However, in forming the patterned organic layer using the LITI method, static electricity may be generated due to friction and the other environmental factors, during the lamination and delamination processes of the donor substrate 20 and the substrate 10. Since such a static electricity has a discharge voltage of several thousand to several tens of thousand volts, it is likely to generate failures of the device such as a short-circuit of jointed parts due to the static electricity, melting of a metal due to a temperature increase in the device, separation of an interconnection, and so on. Moreover, the static electricity may affect an inner circuit of the device to thereby degrade the device characteristics.

SUMMARY OF THE INVENTION

The present invention, therefore, provides a method of fabricating an OLED capable of controlling generation of static electricity when an organic layer is formed by a laser induced thermal imaging method.

In an exemplary embodiment of the present invention, a laser induced thermal imaging apparatus includes: a movable stage; a laminator for laminating a substrate and a donor substrate; and a laser source for scanning a laser to pattern the donor substrate, wherein the stage includes a grounding means formed of a conductive material and disposed at a portion of the stage in contact with the substrate.

In another exemplary embodiment according to the present invention, a method of fabricating an organic light emitting display includes: patterning a first electrode on a substrate; sucking the substrate onto a stage to fix the substrate to the stage; laminating a donor substrate on the substrate using a laminator; selectively irradiating a laser on the donor substrate to transfer an organic layer including at least an emission layer to the substrate; detaching the donor substrate from the substrate after transferring the organic layer to the substrate; and forming a second electrode on the organic layer, wherein the stage includes a grounding means formed at its predetermined part to be grounded.

In addition, the present invention provides an OLED manufactured by the above-mentioned fabricating method.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 2 is a cross-sectional view of a laser induced thermal imaging apparatus in accordance with an embodiment of the present invention.

DETAILED DESCRIPTION OF THE INVENTION

Figure 1A:
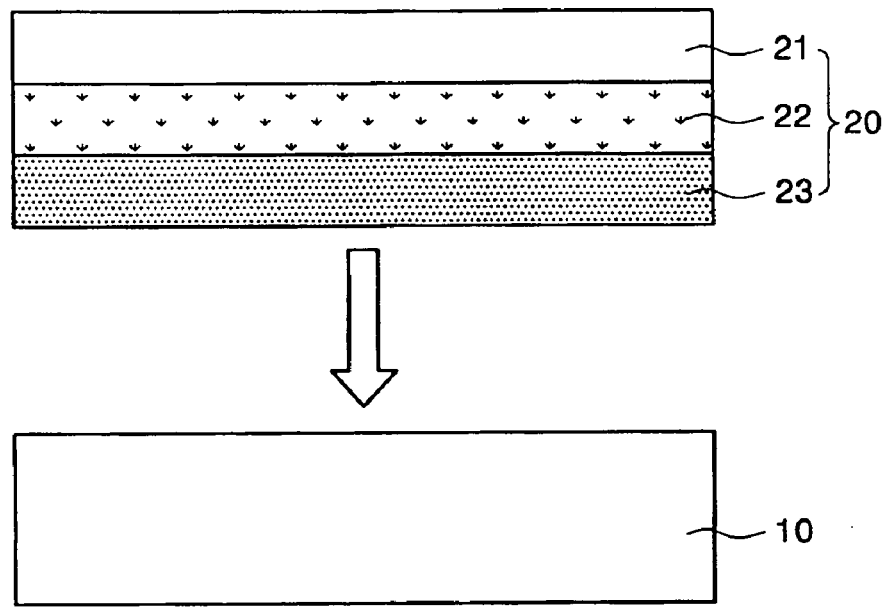
FIGS. 1A to 1C are cross-sectional views illustrating an organic layer patterning process by a laser induced thermal imaging method.
Figure 1B:
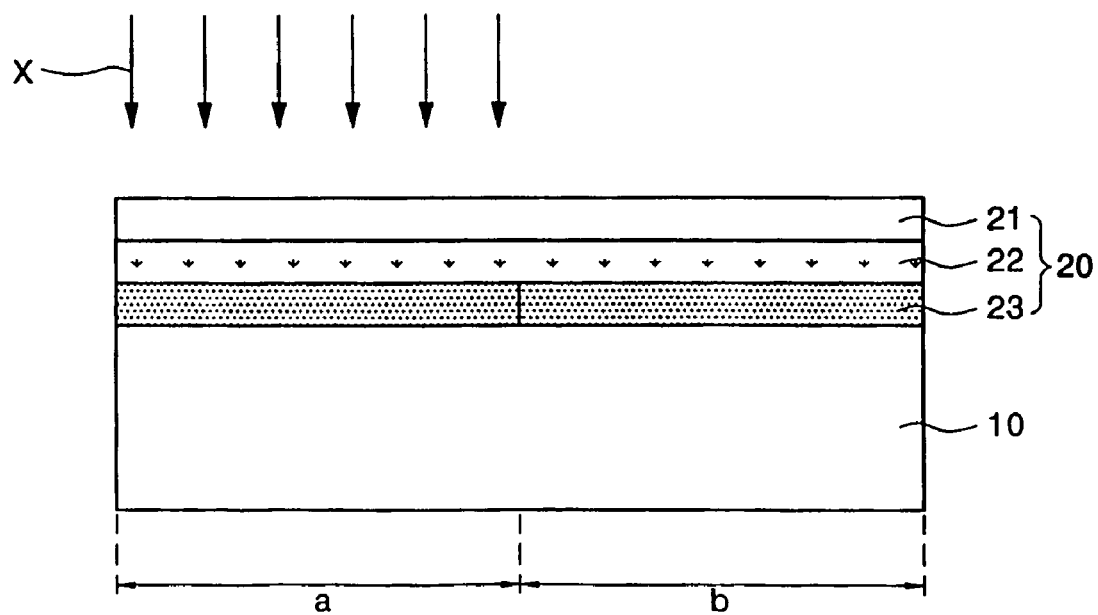
Figure 1C:
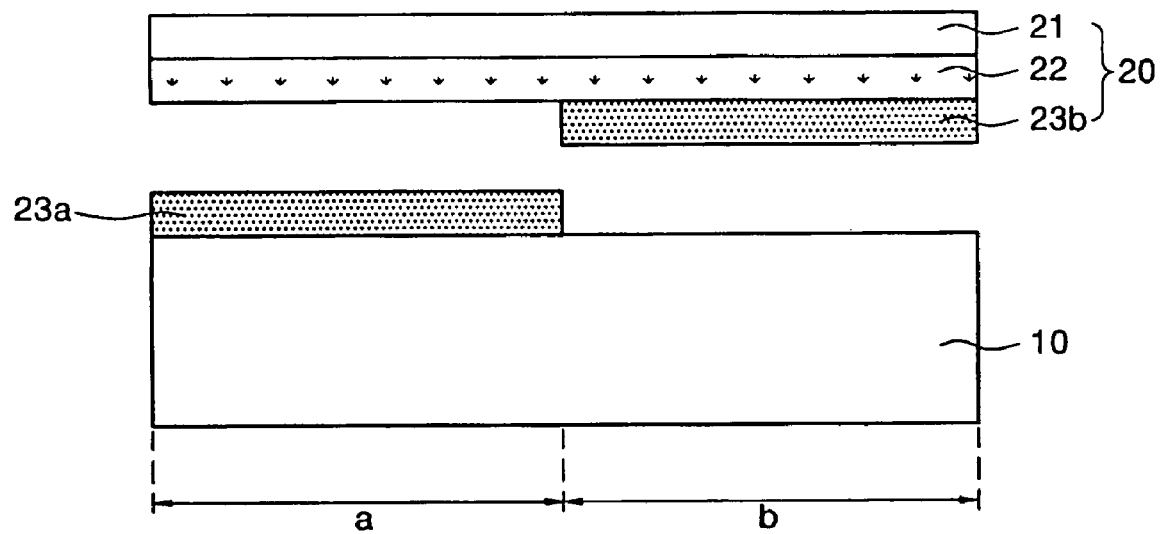

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, length and thickness of layers and regions may be exaggerated for clarity. Like reference numerals designate like elements throughout the specification.

FIG. 2 is a cross-sectional view of a laser induced thermal imaging apparatus in accordance with an embodiment of the present invention.

Referring to FIG. 2, the laser induced thermal imaging apparatus includes a stage 100 for fixing and conveying a substrate; a laminator 400 for laminating the substrate 200 and a donor substrate 300, and a laser source 500 for scanning a laser to pattern the donor substrate.

In this process, the stage 100 includes a conductive grounding means 102 formed at a portion of the stage 100 in contact with the substrate 200 to prevent generation of static electricity during the following process such as lamination, delamination and conveyance. The conductive grounding means 102 may be formed of one conductive material of an organic material, an inorganic material, and an organic-inorganic composite material. For example, the organic material may be one conductive polymer selected from the group consisting of polyaniline, polypyrole, polythiophene, and poly(3,4-ethyl-enedioxythiophene). In addition, the inorganic material may be one selected from the group consisting of antimony tin oxide (ATO), indium tin oxide (ITO), indium zinc oxide (IZO), $Nb_2O_3$, ZnO, and TiN. In addition, the organic-inorganic composite material may be one selected from the group consisting of ATO sol, ITO sol, Ag—Pd, and Ag—Ru.

The conductive grounding means 102 may be formed on an entire upper surface of the stage 100, or may be formed at a predetermined part in an interconnection structure to be grounded through a vacuum suction hole 101 of the stage 100. When the stage is formed of a non-conductive material, the stage 100 should be electrically connected to the grounding means.

At this time, the stage 10 has at least one vacuum suction hole 101 to hold a conveyed substrate by sucking the substrate through the vacuum suction hole 101 using a vacuum pump, and so on.

The laminator 400 can laminate the substrate 200 and the donor substrate 300 using a biasing means such as an air pressure, a roller, and so on.

Hereinafter, a method of fabricating an organic light emitting display using a laser induced thermal imaging apparatus in accordance with the present invention will be described with reference to FIGS. 3A to 3B.

Figure 3A:
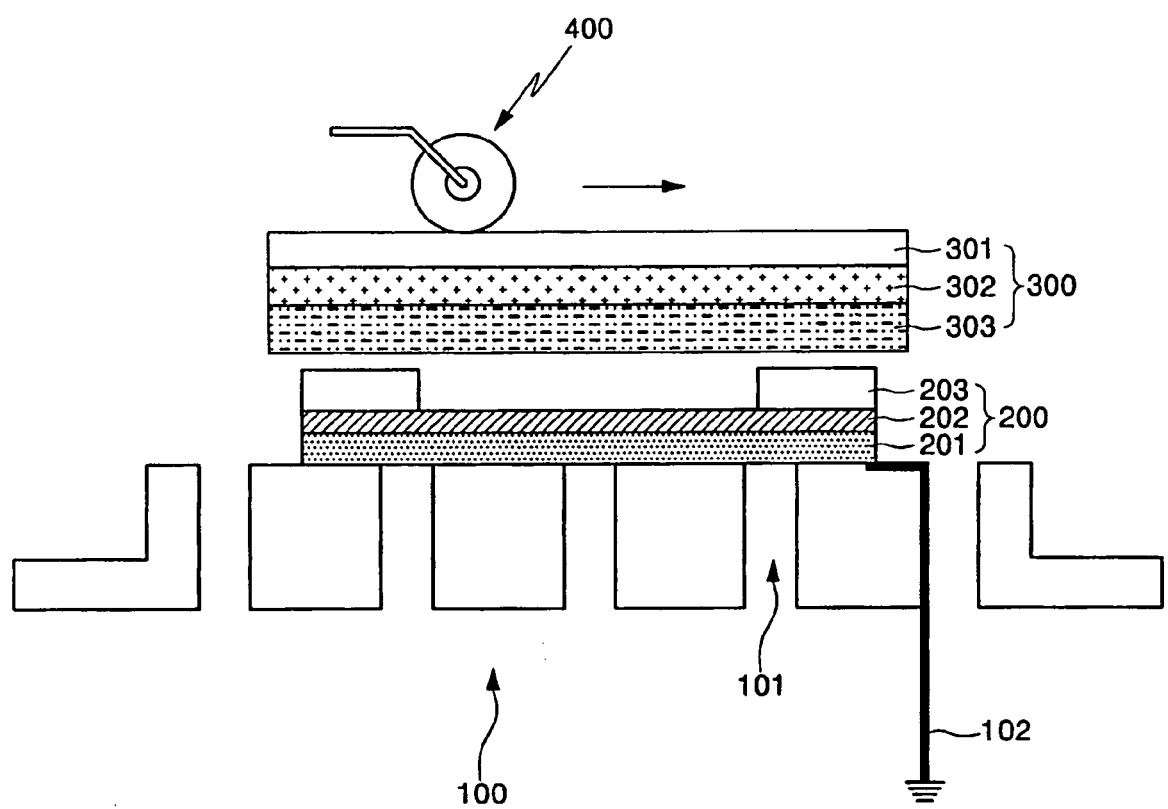
FIGS. 3A to 3C are cross-sectional views illustrating a method of fabricating an OLED by a laser induced thermal imaging method using a laser induced thermal imaging apparatus in accordance with the present invention.

Referring to FIG. 3A, a substrate 200 is supplied onto a stage 100 grounded by a grounding means.

At this time, the substrate 200 includes an insulating substrate 201, a first electrode 202 formed on the insulating substrate 201 using a conventional method, and a pixel defining layer 203 for defining a pixel part on the first electrode 202. In addition, the substrate 200 may include a thin film transistor, a capacitor, and a plurality of insulating layers. When the first electrode 202 is an anode, the first electrode may be a transparent electrode formed of a metal such as ITO or IZO having a high work function, or a reflective electrode formed of one selected from the group consisting of Pt, Au, Ir, Cr, Mg, Ag, Ni, Al, and an alloy thereof.

In addition, when the first electrode 202 is a cathode, the first electrode may be formed of a metal having a low work function selected from the group consisting of Mg, Ca, Al, Ag, Ba, and an alloy thereof, which may be a transparent electrode having a small thickness, or a reflective electrode having a large thickness.

The stage 100 is grounded by the grounding means 102 as described above, and can fix and move the substrate 200 by sucking the substrate 200 through a vacuum suction hole 101 using a suction means such as a vacuum pump (not shown). At this time, since the grounding means 102 is electrically connected to the substrate 200, it is possible to effectively control static electricity which may be generated during a conveyance or lamination process.

Meanwhile, after aligning a donor substrate basically including a base layer 301, a light-to-heat conversion layer 302, and a transfer layer 303 to a pixel region of the substrate 200, the substrate 200 and the donor substrate 300 are laminated by a laminator 400.

In this process, the transfer layer 303 includes at least an emission layer, and, may further include at least one selected from the group consisting of a hole injection layer, a hole transport layer, a hole blocking layer, an electron transport layer, and an electron injection layer in order to improve the device characteristics. In addition, preferably, the donor substrate 300 further includes an intermediate layer for improving transfer characteristics and preventing the transfer layer.

The laminator 400 can be operated by a roller as shown in FIG. 3A or an air pressing method (not shown).

Figure 3B:
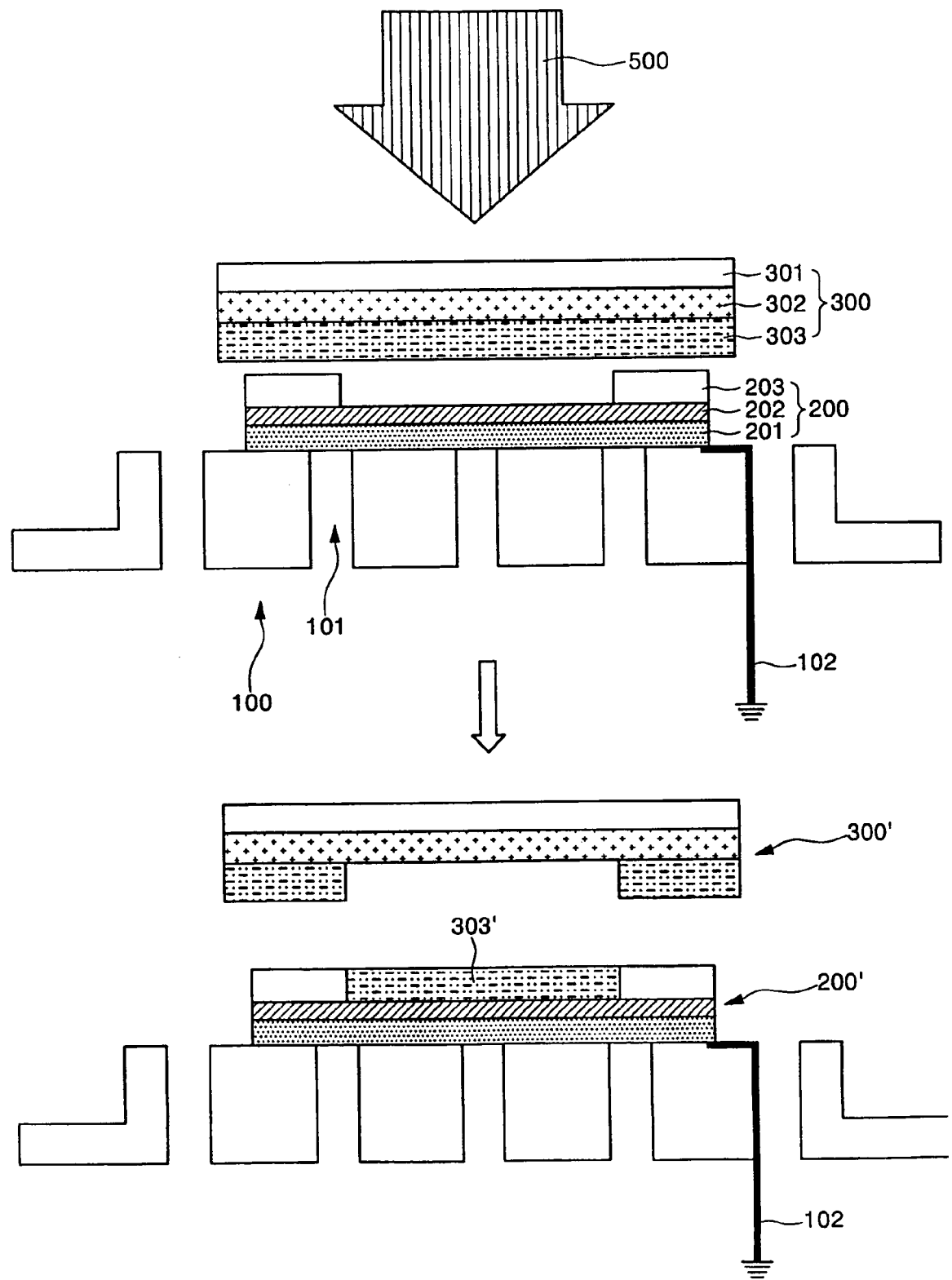

Then, as shown in FIG. 3B, after the lamination, the laser emitted from the laser source 500 is irradiated to a predetermined region of the donor substrate 300 to transfer the transfer layer to a pixel region on the first electrode 202, and then the donor substrate 300' is detached from the substrate 200' to form an organic layer pattern 303' including at least an emission layer. As a result, it is possible to control static electricity, which may be generated due to friction between the substrate and the donor substrate or exterior environment during the lamination and delamination processes, by means of the grounding means of the stage.

In addition, in order to improve the device characteristics, the organic layer may further include at least one selected from the group consisting of a hole injection layer, a hole transport layer, a hole blocking layer, an electron transport layer, and an electron injection layer. In this process, the organic layer may be formed as a common layer by a spin coating method or a deposition method, or may be formed simultaneously when an organic emission layer pattern is formed by the LITI method, after depositing one of the organic emission layer and the organic layer upon forming the transfer layer of the donor substrate.

Figure 3C:
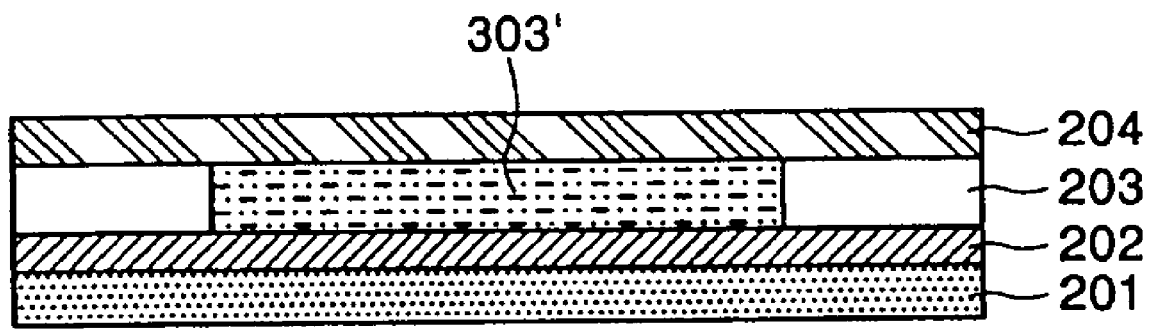

Then, as shown in FIG. 3C, after forming a second electrode 204 on the organic layer pattern, the substrate is encapsulated by a metal can and an encapsulation substrate (not shown) to complete the OLED.

In this process, when the second electrode 204 is a cathode, the second electrode 204 is formed on the organic layer 303', and may be a transparent electrode having a small thickness or a reflective electrode having a large thickness, which may be formed of one conductive metal having a low work function selected from the group consisting of Mg, Ca, Al, Ag, and an alloy thereof.

In addition, when the second electrode 204 is an anode, the second electrode 204 may be a transparent electrode formed of a metal having a high work function such as ITO or IZO, or a reflective electrode formed of one selected from the group consisting of Pt, Au, Ir, Cr, Mg, Ag, Ni, Al and an alloy thereof.

As can be seen from the foregoing, the present invention is capable of forming the organic layer on the stage grounded by the grounding means using the LITI method to effectively control static electricity which may be generated during manufacture of the OLED, thereby preventing degradation of device characteristics and realizing a high quality display.

Although the present invention has been described with reference to certain exemplary embodiments thereof, changes may be made to the described embodiments without departing from the scope of the present invention.

What is claimed is:

1. A laser induced thermal imaging apparatus, comprising:
a movable stage formed of a non-conductive material, the movable stage having at least one through hole;
a laminator for laminating a first substrate and a donor substrate; and
a laser source for scanning a laser to pattern the donor substrate,
the movable stage being electrically connected to a grounding conductor formed of an electrically conductive material and disposed at a portion of the stage in direct contact with the first substrate, the grounding conductor being led via the at least one through hole to electrically connect the portion of the stage to a reference potential.

2. The laser induced thermal imaging apparatus according to claim 1, wherein the stage and the first substrate are electrically connected by the grounding conductor.

3. The laser induced thermal imaging apparatus according to claim 1, wherein the laminator is operated by one of a roll method and an air pressing method.

4. The laser induced thermal imaging apparatus according to claim 1, wherein the stage has at least one vacuum suction hole.

5. A method of fabricating an organic light emitting display device, comprising:
patterning a first electrode on a first substrate;
sucking the first substrate onto a stage formed of a non-conductive material to fix the first substrate to the stage by drawing air through at least one through hole disposed in the stage, and grounding a region where the first substrate and the stage are in direct contact with each other by leading a conductive material electrically connecting to the region via the at least one through hole to a reference potential;
laminating a donor substrate on the first substrate by using a laminator;
selectively irradiating a laser on the donor substrate to transfer an organic layer including at least an emission layer, to the first substrate;
detaching the donor substrate from the first substrate after transferring the organic layer to the first substrate; and
forming a second electrode on the organic layer,
the stage being electrically connected with a grounding conductor formed at its predetermined part to be grounded and formed of an electrically conductive material.

6. The method according to claim 5, wherein the stage and the first substrate are electrically connected by the grounding conductor.

7. The method according to claim 5, wherein the organic layer further comprises at least one selected from the group consisting of a hole injection organic layer, a hole transport organic layer, a hole blocking organic layer, an electron injection organic layer, and an electron transport organic layer.

8. The method according to claim 7, wherein the organic layer is simultaneously formed together with an emission layer by one of a vacuum deposition method, a spin coating method, and a laser induced thermal imaging method.

9. An organic light emitting display manufactured by the fabricating method of claim 5.

10. The method according to claim 5, comprised of applying the laser to scan said patterning of the first electrode.

11. A method of fabricating an organic light emitting display device with the laser induced thermal imaging apparatus of claim 1, comprised of:
patterning a first electrode on the first substrate;
fixing the first substrate on the stage by applying suction to the first substrate; and
laminating the donor substrate on the first substrate with the laminator while said grounding conductor electrically couples the stage and the first substrate to the reference potential.

12. A method of fabricating an organic light emitting display device with the laser induced thermal imaging apparatus of claim 1, comprised of:
patterning a first electrode on the first substrate;
fixing the first substrate on the stage by applying suction to the first substrate;
laminating the donor substrate on the first substrate with the laminator while said grounding conductor electrically couples the stage and the first substrate to the reference potential;

transferring an organic layer including at least an emission layer to the first substrate by selectively irradiating the donor substrate with the laser;

detaching the donor substrate from the first substrate after transferring the organic layer to the first substrate; and forming a second electrode on the organic layer.

13. A laser induced thermal imaging apparatus, comprising:

a movable stage comprised of a suction configuration disposed to hold a first substrate on the stage and an electrical grounding conductor, the movable stage having at least one through hole;

a laminator disposed to laminate the first substrate and a donor substrate while said grounding conductor electrically couples the stage and the first substrate to a reference potential via the at least one through hole disposed in the moveable stage, said grounding conductor disposed at a portion of the moveable stage in direct contact with the first substrate; and a laser source transferring an organic layer including at least an emission layer to the first substrate by selectively irradiating the donor substrate, and enabling the donor substrate to be detached from the first substrate after transferring the organic layer to the first substrate.

14. The laser induced thermal imaging apparatus of claim 1, wherein the grounding conductor is formed of one of an organic material, an inorganic material, and an organic-inorganic composite material; the organic material being a conductive polymer formed of one selected from the group consisting of polyaniline, polypyrole, polythiophene, and poly (3,4-ethylenedioxythiophene); the inorganic material being one selected from the group consisting of antimony tin oxide (ATO), indium tin oxide (ITO), indium zinc oxide (IZO), Nb203, and ZnO; and the organic-inorganic composite material being one selected from the group consisting of ATO sol, ITO sol, Ag—Pd, and Ag—Ru.

15. The method of fabricating an organic light emitting display device of claim 5, wherein the conductive material is one of an organic material, an inorganic material, and an organic-inorganic composite material; the organic material being a conductive polymer formed of one selected from the group consisting of polyaniline, polypyrole, polythiophene, and poly(3,4-ethylenedioxythiophene); and the inorganic material being one selected from the group consisting of antimony tin oxide (ATO), indium tin oxide (ITO), indium zinc oxide (IZO), Nb203, and ZnO; and the organic-inorganic composite material being one selected from the group consisting of ATO sol, ITO sol, Ag—Pd, and Ag—Ru.

16. The laser induced thermal imaging apparatus of claim 13, wherein the grounding conductor is formed of one of an organic material, an inorganic material, and an organic-inorganic composite material; the organic material being a conductive polymer formed of one selected from the group consisting of polyaniline, polypyrole, polythiophene, and poly (3,4-ethylenedioxythiophene); the inorganic material being one selected from the group consisting of antimony tin oxide (ATO), indium tin oxide (ITO), indium zinc oxide (IZO), Nb203, and ZnO; and the organic-inorganic composite material being one selected from the group consisting of ATO sol, ITO sol, Ag—Pd, and Ag—Ru.

* * * * *